United States Patent
Iwase et al.

(10) Patent No.: US 9,947,508 B2
(45) Date of Patent: Apr. 17, 2018

(54) LITHOGRAPHY APPARATUS, AND METHOD OF MANUFACTURING AN ARTICLE

(71) Applicant: CANON KABUSHIKI KAISHA, Tokyo (JP)

(72) Inventors: Daisuke Iwase, Tokyo (JP); Nobushige Korenaga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 24 days.

(21) Appl. No.: 14/698,982

(22) Filed: Apr. 29, 2015

(65) Prior Publication Data

US 2015/0318145 A1 Nov. 5, 2015

(30) Foreign Application Priority Data

May 1, 2014 (JP) ................................ 2014-094878

(51) Int. Cl.
*G03B 27/42* (2006.01)
*H01J 37/317* (2006.01)
*H01J 37/304* (2006.01)
*G03F 7/20* (2006.01)
(Continued)

(52) U.S. Cl.
CPC ...... *H01J 37/3174* (2013.01); *G03F 7/70058* (2013.01); *H01J 37/3045* (2013.01); *H01L 21/2633* (2013.01); *H01L 21/67259* (2013.01); *H01J 2237/1501* (2013.01); *H01J 2237/20292* (2013.01); *H01J 2237/30455* (2013.01)

(58) Field of Classification Search
CPC ............... H01J 37/3174; H01J 37/3045; H01J 2237/30455; H01J 2237/1501; H01J 2237/20292; H01J 2237/3173; H01L 21/2633; H01L 21/67259; G03F 7/70058; G03F 7/70066; G03F 7/70208
See application file for complete search history.

(56) References Cited

U.S. PATENT DOCUMENTS

2001/0026355 A1* 10/2001 Aoki .......................... G03F 1/64
355/30
2007/0109513 A1* 5/2007 Antonius
Leenders ............ G03F 7/70341
355/53
(Continued)

FOREIGN PATENT DOCUMENTS

JP 4205390 B2 1/2009

*Primary Examiner* — Julio J Maldonado
*Assistant Examiner* — Stanetta Isaac
(74) *Attorney, Agent, or Firm* — Rossi, Kimms & McDowell LLP

(57) ABSTRACT

The present invention provides a lithography apparatus that forms a pattern on a substrate, the apparatus comprising a base, a stage configured to hold the substrate and be movable above the base with the stage supported by the base, a patterning device configured to perform patterning on the substrate held by the stage, a chamber housing the base and the stage, and supporting the patterning device, a detector configured to obtain information of relative positions between the patterning device and the base, a driving device configured to move the base, and a controller configured to control the driving device based on the information obtained by the detector such that the relative positions satisfy a predetermined condition.

18 Claims, 2 Drawing Sheets

(51) Int. Cl.
*H01L 21/67* (2006.01)
*H01L 21/263* (2006.01)

(56) References Cited

U.S. PATENT DOCUMENTS

2015/0155137 A1* 6/2015 Sentoku .................. G11B 5/315
430/296
2015/0277229 A1* 10/2015 Kimura ................... G03F 7/704
355/67

* cited by examiner

LITHOGRAPHY APPARATUS, AND METHOD OF MANUFACTURING AN ARTICLE

BACKGROUND OF THE INVENTION

Field of the Invention

The present invention relates to a lithography apparatus, and a method of manufacturing an article.

Description of the Related Art

As circuit patterns in semiconductor integrated circuits have become finer and more highly integrated, attention has been given to drawing apparatuses (lithography apparatuses) that pattern a substrate using a charged particle beam (electron beam). In drawing apparatuses, the irradiation of the substrate with a charged particle beam needs to be performed in a vacuum. For this reason, a movable stage that holds the substrate can be housed in a vacuum chamber as in the drawing apparatus disclosed in Japanese Patent No. 4205390.

When a pressure difference is generated between the interior and exterior of the vacuum chamber, the vacuum chamber can become deformed. In the case where a patterning device that includes a charged particle beam optical system is supported by a vacuum chamber as in the drawing apparatus disclosed in Japanese Patent No. 4205390, the relative positions between the patterning device and the substrate (holding portion) can change due to the deformation of the vacuum chamber. This change can be dealt with by reducing the change in the relative positions through thickening the walls of the vacuum chamber, or correcting the relative positions through driving the substrate with a stage for adjusting the position of the substrate. However, thickening the walls of the vacuum chamber is not desirable from the viewpoint of the weight and cost of the apparatus, and correcting the relative positions by driving the substrate with a stage is not desirable from the viewpoint of the driving stroke of the stage, for example.

SUMMARY OF THE INVENTION

The present invention provides, for example, a technique that is advantageous as countermeasure for deformation of a chamber.

According to one aspect of the present invention, there is provided a lithography apparatus that forms a pattern on a substrate, the apparatus comprising: a base; a stage configured to hold the substrate and be movable above the base with the stage supported by the base; a patterning device configured to perform patterning on the substrate held by the stage; a chamber housing the base and the stage, and supporting the patterning device; a detector configured to obtain information of relative positions between the patterning device and the base; a driving device configured to move the base; and a controller configured to control the driving device based on the information obtained by the detector such that the relative positions satisfy a predetermined condition.

Further features of the present invention will become apparent from the following description of exemplary embodiments with reference to the attached drawings.

DESCRIPTION OF THE EMBODIMENTS

Figure 1:
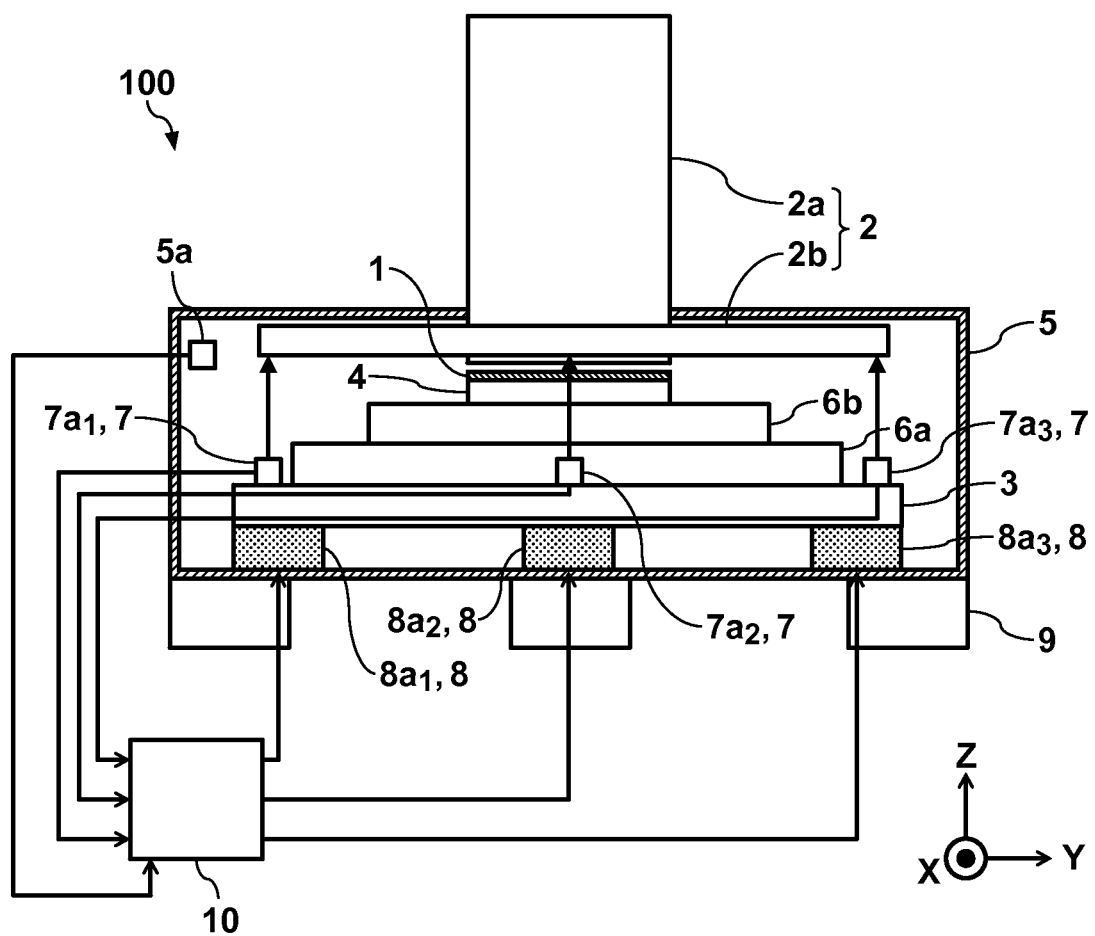
FIG. 1 is a schematic diagram showing a drawing apparatus according to a first embodiment.

Exemplary embodiments of the present invention will be described below with reference to the accompanying drawings. Note that the same reference numerals denote the same members throughout the drawings, and a repetitive description thereof will not be given. Also, although a drawing apparatus that forms a pattern on a substrate by irradiating the substrate with charged particle beams serving as the beams is described in the following embodiments, the present invention is not limited to this. For example, the present invention can also be applied to a lithography apparatus such as an exposure apparatus that exposes a substrate using light (a light beam) as the beam. For example, in the case of an exposure apparatus, there is no limitation to achieving a vacuum state inside the chamber that houses the stage that holds the substrate, and it is possible for the pressure inside the chamber to be set higher than the outside pressure. In this case as well, the chamber deforms due to the pressure difference between the interior and exterior of the chamber, thereby the relative positions between the substrate and the patterning device (e.g., a projection optical system) that forms a pattern on the substrate by irradiating the substrate with a beam (light) may change.

First Embodiment

A drawing apparatus 100 of a first embodiment of the present invention will be described below with reference to FIG. 1. FIG. 1 is a schematic diagram showing the drawing apparatus 100 of the first embodiment. The drawing apparatus 100 can include a patterning device 2 that forms a pattern on a substrate 1 by irradiating the substrate 1 with charged particle beams, a stage 4 that holds the substrate 1 and can move over a base 3, and a controller 10. In the drawing apparatus 100, the irradiation of the substrate 1 with charged particle beams generally needs to be performed in a vacuum. For this reason, in the drawing apparatus 100 of the first embodiment, at least the base 3 and the stage 4 are housed inside a chamber 5, and the patterning device 2 is supported by the upper wall of the chamber 5. Accordingly, in the drawing apparatus 100, a vacuum state can be achieved inside the chamber 5, and the substrate 1 can be irradiated with charged particle beams in a vacuum. Here, the chamber 5 can be supported by a floor on which the drawing apparatus 100 is arranged, via a mount 9 for reducing vibration from the floor, for example. Also, the controller 10 has a CPU, a memory, and the like, and controls processing for drawing on the substrate 1 (controls the devices of the drawing apparatus 100).

The patterning device 2 has a column 2a (irradiation device) that is supported by the chamber 5 and irradiates the substrate 1 with charged particle beams for patterning, for example. The column 2a includes a charged particle source that emits a charged particle beam, blankers for switching between irradiation and non-irradiation of the substrate 1 with charged particle beams, deflectors for scanning the charged particle beams over the substrate, and the like, and emits one or more charged particle beams toward the substrate 1, for example. Also, the patterning device 2 can include a plate 2b that is arranged outside of the column 2a and has a surface that is perpendicular to the direction in which charged particle beams are emitted from the column 2a (e.g., the Z direction). The plate 2b can be used for, for example, the detection of the distance between the patterning device 2 and the base 3 by a later-described detector 7, and supporting a measurement device (not shown) that measures the position of the stage 4. Although the column 2a is supported by the chamber 5 and the plate 2b is supported by the column 2a in the first embodiment, the present invention is not limited to this. For example, a configuration is possible in which the plate 2b is supported by the chamber 5, and the column 2a is supported by the plate 2b. Also, although the case where the patterning device 2 includes one column 2a is described in the first embodiment, the present invention is not limited to this, and the patterning device 2 may include multiple columns 2a, for example. In this case, the plate 2b can be used in common for the columns 2a.

The stage 4 is configured to hold the substrate 1 and be able to move over a base in directions parallel to the surface of the substrate 1 (e.g., the X and Y directions). For example, the drawing apparatus 100 shown in FIG. 1 is provided with an X slider 6a and a Y slider 6b. The X slider 6a can move the Y slider 6b in the X direction over the base 3, and the Y slider 6b can move the stage 4 in the Y direction over the X slider 6a. By providing the X slider 6a and the Y slider 6b over the base 3 in this way, the stage 4 that holds the substrate 1 can be configured so as to be able to move over the base 3. Also, the stage 4 may have a function of adjusting the position of the substrate 1 by driving the substrate in the Z direction and the X and Y directions, a function of rotating the substrate 1 in the e direction, a function of correcting inclination (tilt) of the substrate 1, and the like. In this case, the position of the stage 4 is measured by a measurement device (not shown) provided on the plate 2b of the patterning device 2, for example. The measurement device includes a laser interferometer, for example, and can irradiate a mirror provided on a side surface of the stage 4 with a laser beam, obtain the displacement of the stage 4 from a reference position using the laser beam reflected by the mirror, and obtain the current position of the stage 4 based on the displacement. The controller 10 can precisely position the substrate 1 by controlling the X slider 6a, the Y slider 6b, and the stage 4 so as to reduce deviation between a target position and the current position of the stage 4 measured by the measurement device.

Figure 2:
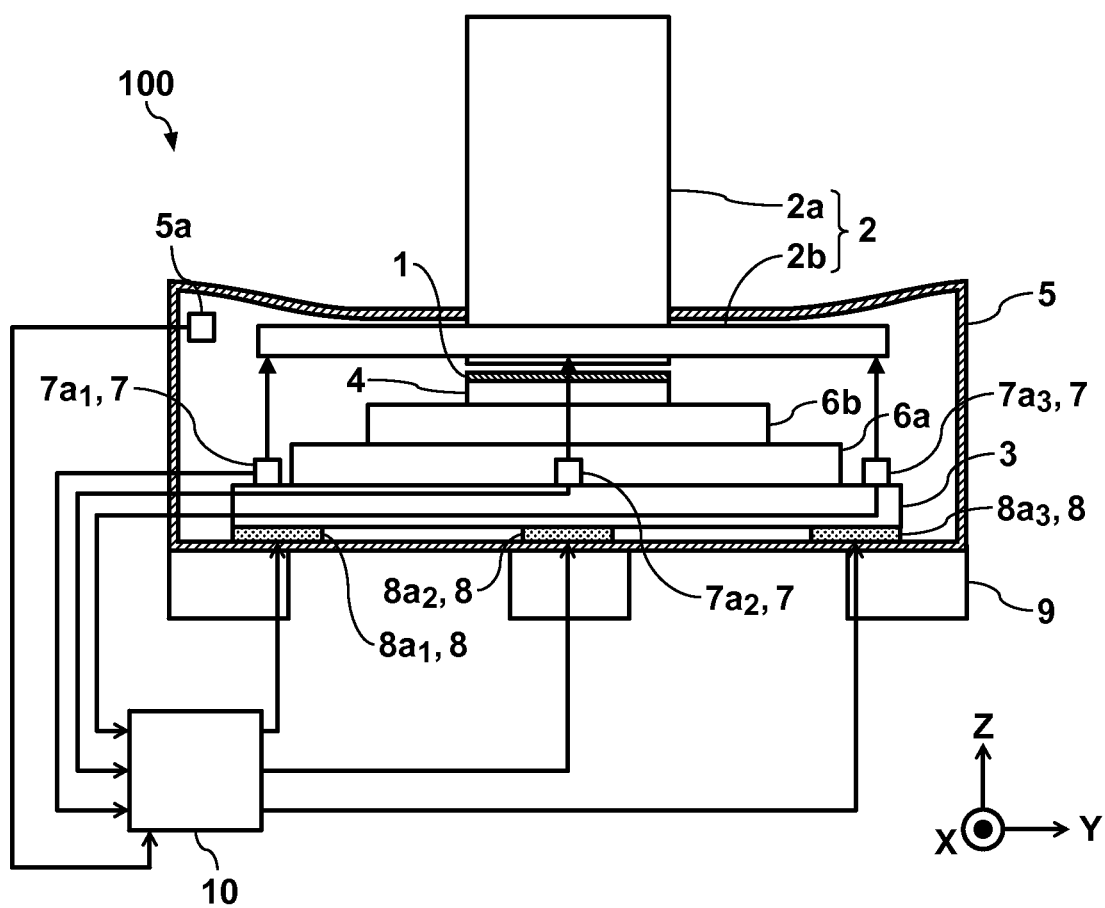
FIG. 2 is a schematic diagram showing the drawing apparatus according to the first embodiment, in which the chamber has become deformed.

In the drawing apparatus 100 having the above configuration, drawing on the substrate 1 is performed in a state in which a vacuum state is achieved inside the chamber 5, as described above. However, since the patterning device 2 is supported by the chamber 5 in the drawing apparatus 100, when a pressure difference is generated between the interior and exterior of the chamber 5, the chamber 5 itself becomes deformed as shown in FIG. 2, and the relative positions between the patterning device 2 and the substrate 1 can change. FIG. 2 is a schematic diagram showing the drawing apparatus 100 of the first embodiment, in which the chamber 5 has become deformed. Conventionally, this change has been dealt with by reducing the change in the relative positions between the patterning device 2 and the substrate 1 through thickening the walls of the chamber 5, or correcting the relative positions through driving the substrate 1 with the stage 4 for adjusting the position of the substrate 1. However, thickening the walls of the chamber 5 is not desirable from the viewpoint of the weight and cost of the apparatus. Also, correcting the relative positions by driving the substrate 1 with the stage 4 can include causing the stage 4 to perform not only substrate 1 focus correction, but also correction of the relative positions occurring due to the deformation of the chamber 5, for example. In this case, the load on the stage 4 is increased, and control of the stage 4 becomes increasingly complex, which is not desirable from the viewpoint of the driving stroke of the stage. Furthermore, if the amount of change in the relative positions between the patterning device 2 and the substrate 1 exceeds the amount by which the substrate 1 can be driven by the stage 4, the relative positions cannot be corrected by merely driving the stage 4, and the patterning device 2 and the substrate 1 can possibly come into contact. In view of this, the drawing apparatus 100 of the first embodiment can include the detector 7 that detects the relative positions between the patterning device 2 and the base 3 (obtains information of the relative positions), and a driving device 8 that is arranged between the base 3 and the bottom wall of the chamber 5 and drives the base 3. Also, the controller 10 controls the driving device 8 such that the relative positions detected by the detector 7 become target relative positions. In the following description, the relative positions between the patterning device 2 and the base 3 can include at least one out of the relative positions (translations) and the relative attitudes, that is to say postures, (rotations) of the patterning device 2 and the base 3.

The detector 7 can include multiple sensors 7a that detect the distance between the base 3 and the plate 2b of the patterning device 2, for example. The sensors 7a may be provided at locations outside the region of the base over which the stage 4 moves. Specifically, the multiple sensors 7a may be provided in a region surrounding the X slider 6a on the base in the drawing apparatus 100 of the first embodiment. Electrostatic capacitance sensors, eddy current sensors, or the like can be used as the sensors 7a, and laser interferometers that use a laser beam to measure the distance between the base 3 and the plate 2b of the patterning device 2 may be used, for example.

The driving device 8 can include multiple actuators 8a that are arranged between the base 3 and the bottom wall of the chamber 5 and drive the base 3, for example. The actuators 8a can include ball screws, air cylinders, piezo actuators, or the like. The actuators 8a may be arranged so as to drive the locations at which the sensors 7a of the detector 7 detect the distance between the plate 2b and the base 3. Also, the driving device 8 may be configured such that the amount by which the driving device 8 can drive the base 3 (movable amount) in the direction in which the relative position relative to the base 3 is changed is greater than the amount by which the stage 4 can drive the substrate 1 (movable amount). The direction in which the relative position relative to the base 3 is changed refers to the direction that is perpendicular to the surface of the substrate 1 (i.e., refers to the Z direction), for example. By configuring the driving device 8 in this way, the relative positions can be corrected even if the amount of change in the relative positions between the patterning device 2 and the substrate 1 exceeds the amount by which the stage 4 can drive the substrate 1. In this case, the driving device 8 can be used to correct the relative positions between the patterning device 2 and the substrate 1 when these relative positions have changed due to a change in the air pressure inside the chamber 5. For this reason, the response speed when the driving device 8 drives the base 3 may be slower than the response speed when the stage 4 drives the substrate 1. Also, the driving device 8 may be configured such that the relative positions between the patterning device 2 and the base 3 do not change when the stage 4 moves over the base 3.

The controller 10 acquires signals output from the sensors 7a of the detector 7 (signals indicating the distance between the patterning device 2 and the base 3), and controls the actuators 8*a* of the driving device 8 based on the signals such that the distances detected by the sensors 7*a* fall within an acceptable range (a tolerance) or satisfy a tolerable or predetermined condition. For example, using a control operation such as a PID operation, the controller 10 determines command values for driving the actuators 8*a* of the driving device 8 such that the distances between the patterning device 2 and the base 3 detected by the sensors 7*a* fall within the acceptable range. The controller 10 then supplies signals (currents, voltages, or the like) corresponding to the determined command values to the actuators 8*a*. At this time, if one sensor 7*a* and one actuator 8*a* are provided at each location on the base 3, it is sufficient that the controller 10 determines the command value for the actuator 8*a* based on the detection result obtained by the corresponding sensor 7*a*. For example, it is sufficient that the controller 10 determines the command value for an actuator $8a_1$ based on the detection result obtained by a sensor $7a_1$. Similarly it is sufficient that the controller 10 determines the command value for an actuator $8a_2$ based on the detection result obtained by a sensor $7a_2$ and determines the command value for an actuator $8a_3$ based on the detection result obtained by a sensor $7a_3$. In this way, the controller 10 determines command values for the actuators 8*a* that drive respective locations on the base 3, based on the detection results obtained by the sensors 7*a* that detect the distance to the base 3 at the corresponding locations. Accordingly, the drawing apparatus 100 can correct not only the relative positions between the patterning device 2 and the base 3 in the direction perpendicular to the surface of the substrate 1, but also the relative attitudes (tilts) of the patterning device 2 and the base 3.

As described above, the drawing apparatus 100 of the first embodiment includes the detector 7 that detects the relative positions between the patterning device 2 and the base 3, and the driving device 8 that drives the base 3. Also, the drawing apparatus 100 controls the driving device 8 such that the relative positions detected by the detector 7 become target relative positions. Accordingly, the drawing apparatus 100 can correct the relative positions between the patterning device 2 and the substrate 1 even if these relative positions change due to deformation of the chamber 5.

In this case, as described above, the drawing apparatus 100 of the first embodiment can change the position and attitude of the base 3 itself according to the tilt of the patterning device 2 caused by deformation of the chamber 5, for example. In other words, the drawing apparatus 100 can arrange the base 3 so as to be perpendicular to the direction of emission (emission direction) of charged particle beams from the patterning device 2. In this case, it is sufficient that the substrate 1 is moved in the directions that are parallel to the emission direction by driving the X slider 6*a* and the Y slider 6*b*. For this reason, the drawing apparatus 100 of the first embodiment can easily perform control for substrate 1 positioning by reducing the load on the stage 4 for adjusting the distance between the patterning device 2 and the substrate 1 and the tilt of the substrate 1 when the substrate 1 is being moved in the directions perpendicular to the emission direction.

Also, the drawing apparatus 100 (controller 10) may control the driving device 8 in real-time such that the relative positions between the patterning device 2 and the base 3 become target relative positions while the drawing apparatus 100 is activating, but the present invention is not limited to this. For example, at the time of the activation of the drawing apparatus 100 for example, the controller 10 may control the driving device 8 such that the relative positions between the patterning device 2 and the base 3 become the target relative positions if the pressure inside the chamber is reduced from atmospheric pressure before the start of the formation of a pattern on the substrate 1 by the patterning device 2. In other words, the controller 10 may control the driving device 8 in the period in which the pressure inside the chamber is being changed before the start of the formation of a pattern on the substrate 1 by the patterning device 2. Furthermore, the drawing apparatus 100 may include a measurement device 5*a* that measures the pressure inside the chamber, for example, and the controller 10 may control the driving device 8 when the pressure inside the chamber measured by the measurement device 5*a* has changed by an amount greater than or equal to a threshold value. In other words, using the fact that the amount of change in the pressure inside the chamber measured by the measurement device 5*a* is greater than or equal to the threshold value as a trigger, the controller 10 may cause the detector 7 to detect the distance between the patterning device 2 and the base 3, and control the driving device 8 based on the detection result.

<Embodiment of Method of Manufacturing an Article>

A method of manufacturing an article according to this embodiment of the present invention is favorable in, for example, manufacturing articles such as microdevices (e.g., semiconductor devices) and elements having a fine structure. The method of manufacturing an article of the present embodiment includes a step of forming a latent pattern in a photosensitizer applied to substrate, using the above-described lithography apparatus (drawing apparatus) (step of perform drawing on a substrate), and a step of processing (e.g., developing) the substrate on which the latent pattern was formed in the previous step. Furthermore, this manufacturing method includes other known steps (e.g., oxidation, film formation, vapor deposition, doping, planarization, etching, resist peeling, dicing, bonding, and packaging). The method of manufacturing an article of the present embodiment is advantageous over conventional methods in at least one of article performance, quality, productivity, and production cost. Note that the lithography apparatus is not limited to an apparatus that performs patterning on a substrate using a beam (e.g., a charged particle beam or EUV light), and may be an imprint apparatus. In this case, the aforementioned developing step can be replaced with a known etching step of eliminating a residual layer in a resist pattern that was formed, or another known step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-094878 filed on May 1, 2014, which is hereby incorporated by reference herein in its entirety.

What is claimed is:

1. A lithography apparatus that forms a pattern on a substrate, the apparatus comprising:
   a base;
   a stage configured to hold the substrate and be movable above the base with the stage supported by the base;
   a patterning device configured to perform patterning on the substrate held by the stage;
   a vacuum chamber housing the base and the stage, and supporting the patterning device;
   a detector configured to obtain information of a relative position between the patterning device and the base;
   a driving device configured to move the base; and a controller configured to cause the driving device to move the base based on the information obtained by the detector to adjust the relative position, wherein the patterning device includes an irradiation device configured to irradiate the substrate with a beam for forming the pattern, and a portion of the patterning device is housed in the vacuum chamber, and wherein the detector is configured to obtain, as the information, information of a relative position between the portion of the patterning device housed in the vacuum chamber and the base.

2. The apparatus according to claim 1, wherein the controller is configured to control the driving device such that the relative position satisfies a predetermined condition in a case where a pressure in the vacuum chamber is reduced from an atmospheric pressure.

3. The apparatus according to claim 1, further comprising a measurement device configured to measure the pressure in the vacuum chamber, wherein the controller is configured, in a case where the pressure measured by the measurement device changes by an amount not smaller than a threshold, to cause the detector to obtain the information to control the driving device.

4. The apparatus according to claim 1, wherein the stage is movable relative to the base in a direction in which the relative position is changed by the driving device, and a movable amount of the base in the direction by the driving device is greater than a movable amount of the stage relative to the base in the direction.

5. The apparatus according to claim 1, wherein the relative position is related to at least one of a relative translation and a relative rotation.

6. The apparatus according to claim 1, wherein the detector includes a plurality of sensors each detecting a distance between the portion of the patterning device housed in the vacuum chamber and the base, and the controller is configured to control the driving device based on outputs from the plurality of sensors.

7. The apparatus according to claim 1, wherein the driving device includes a plurality of actuators each moving the base, and the controller is configured to control the plurality of actuators based on an output from the detector.

8. The apparatus according to claim 1, wherein the patterning device includes a plurality of ones of the irradiation device.

9. The apparatus according to claim 1, wherein the detector is supported by the base outside a region of the base over which the stage moves.

10. The apparatus according to claim 1, wherein the detector includes at least one of an electrostatic capacitance sensor and an eddy current sensor.

11. The apparatus according to claim 1, further comprising a measurement device configured to measure a position of the stage, wherein the controller is further configured to control the position of the stage based on a measurement by the measurement device.

12. The apparatus according to claim 11, further comprising a positioning mechanism disposed on the base and configured to position the stage, wherein the controller is configured to cause the positioning mechanism to position the stage based on the measurement by the measurement device.

13. The apparatus according to claim 12, wherein the positioning mechanism includes at least one slider to move the stage.

14. The apparatus according to claim 12, wherein a response speed of the driving device is lower than a response speed of the positioning mechanism.

15. The apparatus according to claim 1, wherein the controller is configured to control the driving device based on the information obtained by the detector such that a change in the relative position between the patterning device and the base due to deformation of the vacuum chamber is reduced.

16. The apparatus according to claim 1, wherein the patterning device includes, as the portion of the patterning device housed in the vacuum chamber, a plate supported by the irradiation device, and wherein the detector includes a sensor configured to obtain a distance between the plate and the base to obtain the information of the relative position between the patterning device and the base.

17. The apparatus according to claim 1, further comprising a positioning mechanism disposed on the base and configured to position the stage.

18. The apparatus according to claim 1, further comprising a measurement device configured to measure a position of the stage, wherein the portion of the patterning device housed in the vacuum chamber supports the measurement device.

* * * * *